(12) United States Patent
Chang et al.

(10) Patent No.: US 8,009,498 B2
(45) Date of Patent: Aug. 30, 2011

(54) MEMORY REFRESH SYSTEM AND OPERATING METHOD THEREOF

(75) Inventors: Meng-Fan Chang, Taichung (TW); Chih-Wen Cheng, Taipei County (TW)

(73) Assignee: National Tsing Hua University, Hsin-Chu (TW)

( * ) Notice: Subject to any disclaimer, the term of this patent is extended or adjusted under 35 U.S.C. 154(b) by 68 days.

(21) Appl. No.: 12/616,910

(22) Filed: Nov. 12, 2009

(65) Prior Publication Data

US 2011/0110175 A1    May 12, 2011

(51) Int. Cl.
*G11C 7/00* (2006.01)
(52) U.S. Cl. ... 365/222; 365/207; 365/196; 365/189.09; 365/189.07; 365/194
(58) Field of Classification Search ............... 365/222, 365/207, 196, 189.07, 189.09, 194
See application file for complete search history.

(56) References Cited

U.S. PATENT DOCUMENTS

2005/0162931 A1*   7/2005   Portmann et al. ........ 365/189.01
* cited by examiner

*Primary Examiner* — Thong Q Le
(74) *Attorney, Agent, or Firm* — WPAT, P.C.; Anthony King (57) ABSTRACT

A memory refresh system includes a comparative detection circuit, a logic circuit, and a timing circuit. The comparative detection circuit detects a voltage of the storage capacitor of a memory cell of the memory and generates a corresponding digital code by comparing the voltage with a reference voltage. Each memory cell has a corresponding digital code. The combination of the digital codes of the memory cells forms a first state. After a specific period of time, the voltages of the storage capacitors of the memory cells are once detected by the comparative detection circuit, and corresponding digital codes are generated and combined to form a second state. The logic circuit compares the first state and the second state to determining whether or not to change the refresh period of a refresh period detecting process. The timing circuit changes the refresh period according to the determination result of the logic circuit.

12 Claims, 7 Drawing Sheets

MEMORY REFRESH SYSTEM AND OPERATING METHOD THEREOF

BACKGROUND OF THE INVENTION

1. Field of the Invention

The present invention relates to a memory refresh system and an operating method thereof, in particular to an embedded dynamic random access memory (eDRAM) refresh system and its operating method.

2. Description of the Related Art

DRAM devices are popular memory devices for storing data in electronic systems. As low power electronic devices are introduced, it is an important subject for DRAM designers to reduce the power consumption. Traditionally, a memory cell of a DRAM includes a transistor and a storage capacitor. The storage capacitor is charged for writing in data. However, after read and write operations have not been executed for a while, a leakage current may result and remove electric charges stored in storage capacitor to cause a data loss, and thus a refresh operation is required to rewrite the data.

Since the leakage current of the storage capacitor is closely related to temperature, therefore the leakage current will rise with temperature rapidly. On the other hand, the leakage current will drop with temperature rapidly. If the operating temperature drops, the memory cell needs not to rewrite the data so frequently. If a refresh frequency is adjusted according to the temperature, then the power consumption of the DRAM will be reduced. In the prior art, a temperature sensor is used for detecting the temperature of the memory, and the temperature sensor can change a self-refresh period according to the detected temperature. For instance, if the temperature sensor detects a lower temperature, the self-refresh period can be maintained for a longer time to reduce the current loss, so as to achieve the effect of power saving.

SUMMARY OF THE INVENTION

In view of the aforementioned shortcomings of the conventional memory refresh system and its operating method having a data loss due to a removal of electric charges stored in from a storage capacitor for overcoming leakage currents, the inventor of the present invention based on years of experience in the related industry to conduct extensive researches and experiments, and finally developed a feasible solution to overcome the aforementioned shortcomings of the prior art.

It is a primary objective of the present invention to overcome the shortcomings of the prior art by providing a memory refresh system, comprising a comparative detection circuit, a logic circuit and a timing circuit. The comparative detection circuit is provided for detecting a voltage of a storage capacitor of a memory cell of a memory, and generating a corresponding digital code by comparing the voltage and the reference voltage. Each memory cell has a corresponding digital code. The combination of the digital codes of the memory cells forms a first state. After a specific period of time, the voltages of the storage capacitors of the memory cells is once detected by the comparative detection circuit, and corresponding digital codes are generated and combined to form a second state. The logic circuit is provided for comparing the first state and the second state to determine whether or not to change a refresh period of a refresh period detecting process for refreshing data stored in the memory cell. The timing circuit is provided for changing the refresh period according to the determination result of the logic circuit.

The voltage is operated within a range from $\tfrac{1}{2}V_{DD}+100$ mV to $V_{DD}$, and 100 mV is used for sensing margin of the sense amplifier.

If the first state and the second state have a same combination of digital codes, then the refresh period will be increased.

If the first state and the second state have the same combination digital codes, then the refresh period will be increased by two or more times.

If the first state and the second state have a different combination of digital codes, then the refresh period will be constant.

If the voltage of each memory cell is lower than the reference voltage ($\tfrac{1}{2}V_{DD}+100$ mV), the refresh period detecting process will be terminated.

Another objective of the present invention is to provide an operating method of a memory refresh system, and the method comprises the steps of: detecting a voltage of a storage capacitor of a memory cell of a memory with a comparative detection circuit; generating a corresponding digital code by comparing the voltage with a reference voltage with the comparative detection circuit, and each memory cell having a corresponding digital code; forming a first state by combining the digital codes of the memory cells; detecting the voltages of the storage capacitors of the memory cells with the comparative detection circuit, and corresponding digital codes being generated and combined to form a second state; comparing the first state and the second state with a logic circuit to determine whether or not to change a refresh period of a refresh period detecting process for refreshing data stored in the memory cell; changing the refresh period with a timing circuit according to a determination result of the logic circuit.

The voltage is operated in a range from $\tfrac{1}{2}V_{DD}+100$ mV to $V_{DD}$, and 100 mV is used for sensing margin of the sense amplifier.

If the first state and the second state have a same combination of digital codes, then the refresh period will be increased.

If the first state and the second state have the same combination digital codes, then the refresh period will be increased by two or a more times.

If the first state and the second state have a different combination of digital codes, then the refresh period will be constant.

If the voltage of each memory cell is lower than the reference voltage, the refresh period detecting process will be terminated.

In summation of the description above, the memory refresh system and its operating method in accordance with the present invention have one or more of the following advantages:

(1) The memory refresh system and its operating method may detect the variation of voltage to change the refresh period for refreshing data, so as to achieve the power saving effect.

(2) The memory refresh system and its operating method will not destroy the structure of the memory in the memory cell.

(3) The memory refresh system and its operating method do not require measuring the temperature of the memory, and the variation of voltage provides the information above the trend of a temperature change.

DETAILED DESCRIPTION OF THE PREFERRED EMBODIMENTS

Figure 1:
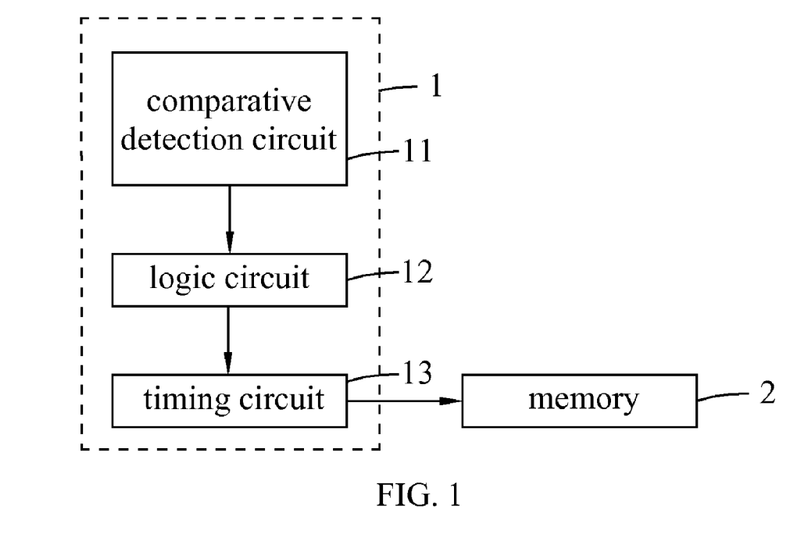
FIG. 1 is a schematic view of a memory refresh system of the present invention.
Figure 2:
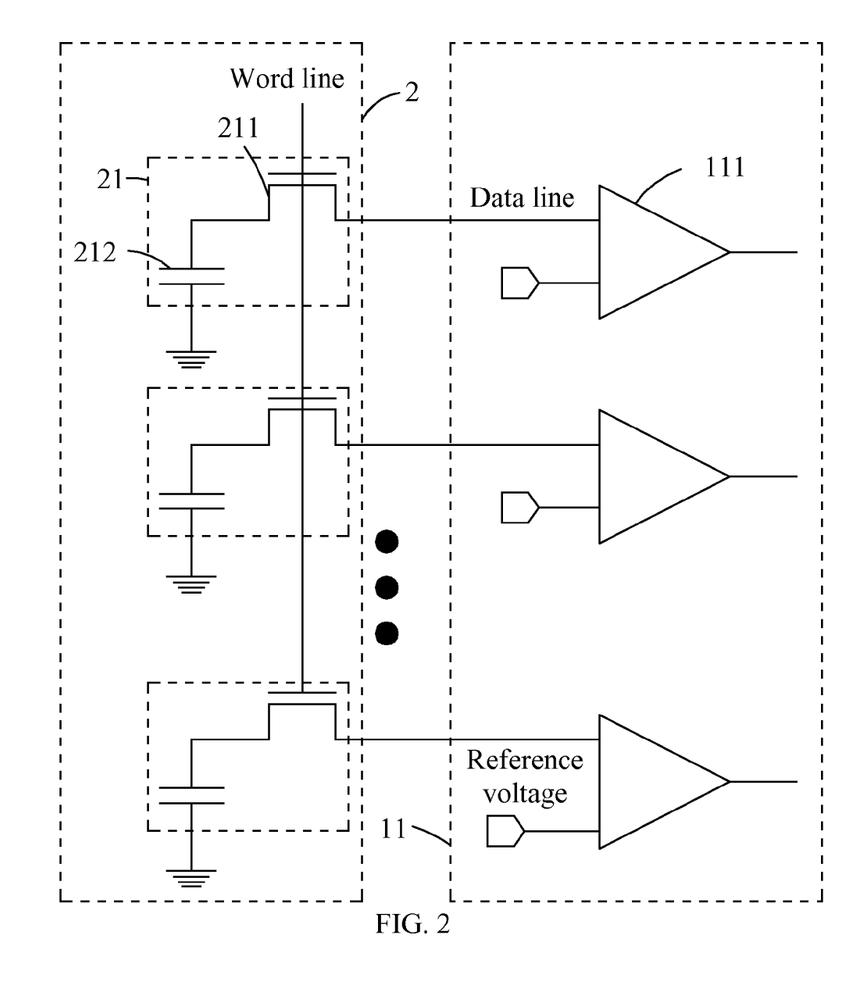
FIG. 2 is a schematic view showing a comparative detection circuit that detects a memory.

With reference to FIG. 1 for a schematic view of a memory refresh system of the present invention, the refresh system 1 of the memory 2 comprises a comparative detection circuit 11, a logic circuit 12 and a timing circuit 13. With reference to FIG. 2 for a schematic view of a comparative detection circuit 11 that detects the memory 2, a memory cell 21 of the memory 2 is formed with a transistor 211 and a storage capacitor 212. The comparative detection circuit 11 is provided for detecting a voltage of the storage capacitor 212 of the memory cell 21, and the comparator 111 is provided for comparing the voltage of the storage capacitor 212 with a reference voltage to generate a digital code 0 or 1. If the voltage of the storage capacitor 212 is lower than the reference voltage, then the digital code 1 will be generated. If the voltage of the storage capacitor 212 is higher than the reference voltage, then the digital code 0 will be maintained. Each memory cell 21 has a corresponding digital code; for example, there are ten memory cells 21 as shown in FIG. 2 corresponding to the ten digital codes based on the comparison result of the comparator 111 to form a first state, and the ten memory cells 21 are detected one by one after a specific period of time, and correspond to the ten digital codes to form a second state. For example, if the first state is (0000000000), it means that the voltages of the storage capacitors 212 of all of the ten memory cells 21 are higher than the reference voltage. If the second state is (1111000000), it means that the voltages of the storage capacitors 212 of four memory cells 21 are lower than the reference voltage.

The logic circuit 12 compares the first state and the second state to determine whether or not to change the refresh period of the refresh period detecting process for refreshing data. For example, if time t=0, then the first state will be (0000000000); and if time t=$t_1$, then the second state is (1111000000). Since the first state and the second state have a different combination of digital codes, therefore the refresh period is maintained to be $t_1$, and the time $t_1$ is used for refreshing data. If time t=0, then the first state is (0000000000); and if time t=$t_1$, then the second state is (0000000000). Since the first state and the second state have the same combination of digital codes, therefore the refresh period may be increased by two or a more times for refreshing data. Now, the refresh period is 2$t_1$ or a multiple of $t_1$. If the logic circuit 12 determines that the first state or the second state is (1111111111), it means that the voltages of the storage capacitors 212 of all memory cells 21 are lower than the reference voltage, and the logic circuit 12 will determine to terminate refresh period detecting process for refreshing data, and thus the timing circuit 13 may change the refresh period or terminate the refresh period detecting process according to the determination result of the logic circuit 12.

Figure 3:
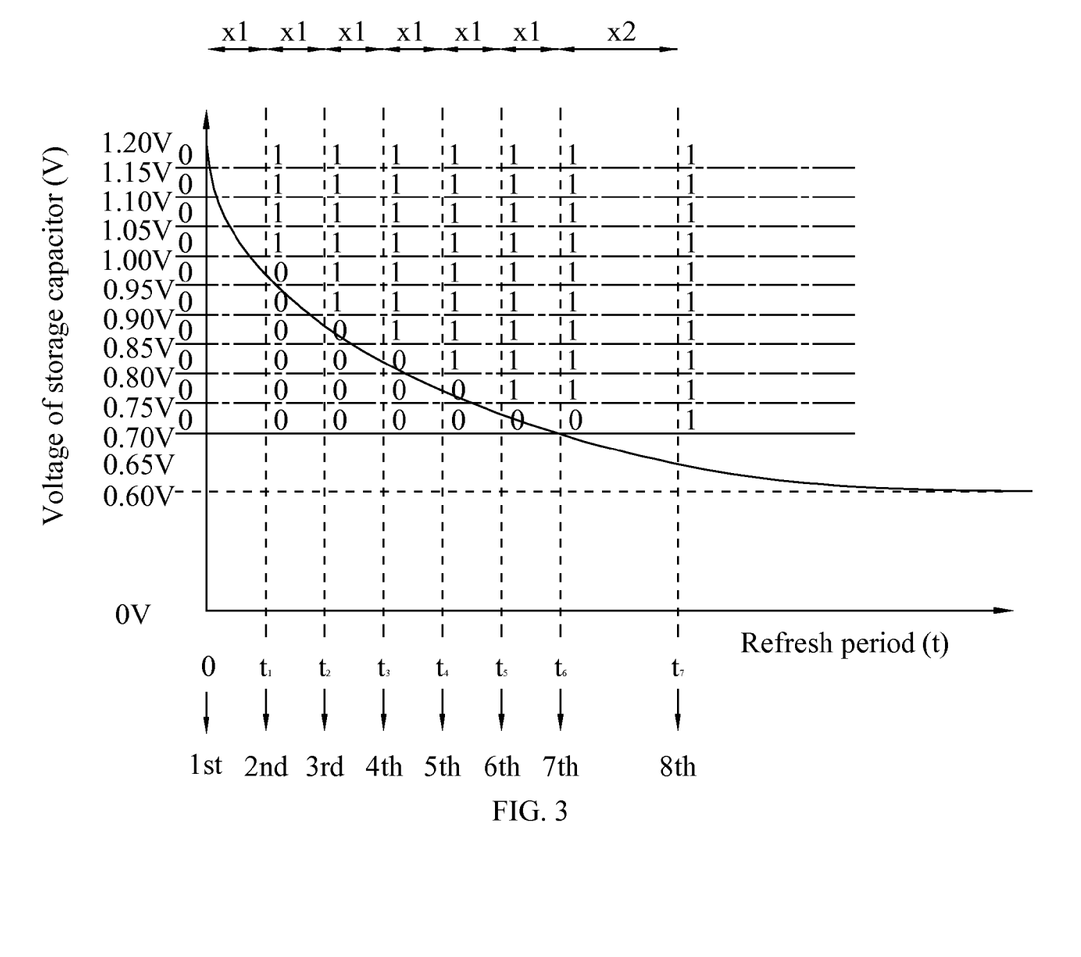
FIG. 3 is a schematic view of a memory refresh system in accordance with a first preferred embodiment of the present invention.

With reference to FIG. 3 for a schematic view of a memory refresh system in accordance with a first preferred embodiment of the present invention, the storage capacitor in the memory is operated at a voltage from ½$V_{DD}$+100 mV to $V_{DD}$, provided that the memory operating temperature is room temperature. If the operating voltage of the memory is 1.2V, then the storage capacitor is operated at a voltage from 0.7V to 1.2V.

If time t=0, the comparative detective circuit 11 will not perform any detection, and the first state with a combination of digital codes equal to (0000000000) is set as a default value.

If time t=$t_1$, then the comparative detection circuit 11 will perform a first detection, and the comparative detection circuit 11 will detect a voltage of the storage capacitor 212 of the memory cell 21 in the memory 2, and use the comparator 111 to compare the voltage with the reference voltage to form a second state with a combination of digital codes equal to (1111000000), wherein the first state and the second state have different combination of digital codes, and thus the refresh period is maintained at $t_1$ for refreshing the data of the storage capacitor. When the second detection is performed, the detection time $t_2$ is equal to the time $t_1$ of the first detection plus the refresh period $t_1$. In other words, the time $t_2$=$t_1$+$t_1$ for the second detection.

If time t=$t_2$, then the comparative detection circuit 11 will perform a second detection, the comparative detection circuit 11 will also detect a voltage of the storage capacitor 212 of the memory cell 21 in the memory 2, and use the comparator 111 to compare the voltage with the reference voltage to form a second state with a combination of digital codes equal to (1111110000), wherein the first state uses the combination of digital codes at t=$t_1$ as a comparison standard, and whose combination of digital codes is equal to (1111000000). Since the first state and the second state have different combination of digital codes, therefore the refresh period is maintained at $t_1$ to refresh the data of the storage capacitor, such that when the third detection is performed, the detection time $t_3$ is equal to the time $t_2$ of the second detection plus the refresh period $t_1$. In other words, the time $t_3$=$t_1$+$t_1$+$t_1$ for the third detection.

If time t=$t_3$, then the comparative detection circuit 11 will perform a third detection, and the comparative detection circuit 11 will also detect a voltage of the storage capacitor 212 of the memory cell 21 in the memory 2, and use the comparator 111 to compare the voltage with the reference voltage to form a second state with a combination of digital codes equal to (1111111000), wherein the first state uses the combination of digital codes at t=$t_2$ as a comparison standard, and whose combination of digital codes is equal to (1111110000). Since the first state and the second state have different combination of digital codes, therefore the refresh period is maintained at $t_1$ to refresh the data of the storage capacitor, such that when the fourth detection is performed, the detection time $t_4$ is equal to the time $t_3$ of the third detection plus the refresh period $t_1$. In other words, the time $t_4$=$t_1$+$t_1$+$t_1$+$t_1$ for the fourth detection.

If time t=$t_4$, then the comparative detection circuit 11 will perform a fourth detection, and the comparative detection circuit 11 will also detect a voltage of the storage capacitor 212 of the memory cell 21 in the memory 2, and use the comparator 111 to compare the voltage with the reference voltage to form a second state with a combination of digital codes equal to (1111111100), wherein the first state uses the combination of digital codes at t=$t_3$ as a comparison standard, and whose combination of digital codes is equal to (1111111000). Since the first state and the second state have different combination of digital codes, therefore the refresh period is also maintained at $t_1$ to refresh the data of the storage capacitor, such that when the fifth detection is performed, the detection time $t_5$ is equal to the time $t_4$ of the fourth detection plus the refresh period $t_1$. In other words, the time $t_5=t_1+t_1+t_1+t_1+t_1$ for the fifth detection.

If time $t=t_5$, then the comparative detection circuit 11 will perform a fifth detection, and the comparative detection circuit 11 will also detect a voltage of the storage capacitor 212 of the memory cell 21 in the memory 2, and use the comparator 111 to compare the voltage with the reference voltage to form a second state with a combination of digital codes equal to (1111111110), wherein the first state uses the combination of digital codes at $t=t_4$ as a comparison standard, and whose combination of digital codes is equal to (1111111100). Since the first state and the second state have different combination of digital codes, therefore the refresh period is also maintained at $t_1$ to refresh the data of the storage capacitor, such that when the sixth detection is performed, the detection time $t_6$ is equal to the time $t_5$ of the fifth detection plus the refresh period $t_1$. In other words, the time $t_6=t_1+t_1+t_1+t_1+t_1+t_1$ for the sixth detection.

If time $t=t_6$, then the comparative detection circuit 11 will perform a sixth detection, and the comparative detection circuit 11 will also detect a voltage of the storage capacitor 212 of the memory cell 21 in the memory 2, and use the comparator 111 to compare the voltage with the reference voltage to form a second state with a combination of digital codes equal to (1111111110), wherein the first state uses the combination of digital codes at $t=t_5$ as a comparison standard, and whose combination of digital codes is equal to (1111111110). Since the first state and the second state have the same combination of digital codes, therefore it is necessary to increase the refresh period for refreshing the data of the storage capacitor. If the seventh detection is taken place at twice of the refresh period, then the detection time $t_7$ will be equal to the time $t_6$ of the sixth detection plus the refresh period $2t_1$. In other words, the time $t_7=t_1+t_1+t_1+t_1+t_1+t_1+2t_1$ for the seventh detection.

If time $t=t_7$, then the comparative detection circuit 11 will perform an seventh detection, and the comparative detection circuit 11 will also detect a voltage of the storage capacitor 212 of the memory cell 21 in the memory 2, and use the comparator 111 to compare the voltage with the reference voltage to form a second state with a combination of digital codes equal to (1111111111). If the logic circuit 12 determines that the second state is equal to (1111111111), it means the voltages of the storage capacitors 212 of all memory cells 21 are lower than the reference voltage. The logic circuit 12 determines to terminate the refresh period detecting process used for refreshing data, and thus the timing circuit 13 may terminate the refresh period detecting process according to the determination result of the logic circuit 12.

Figure 4:
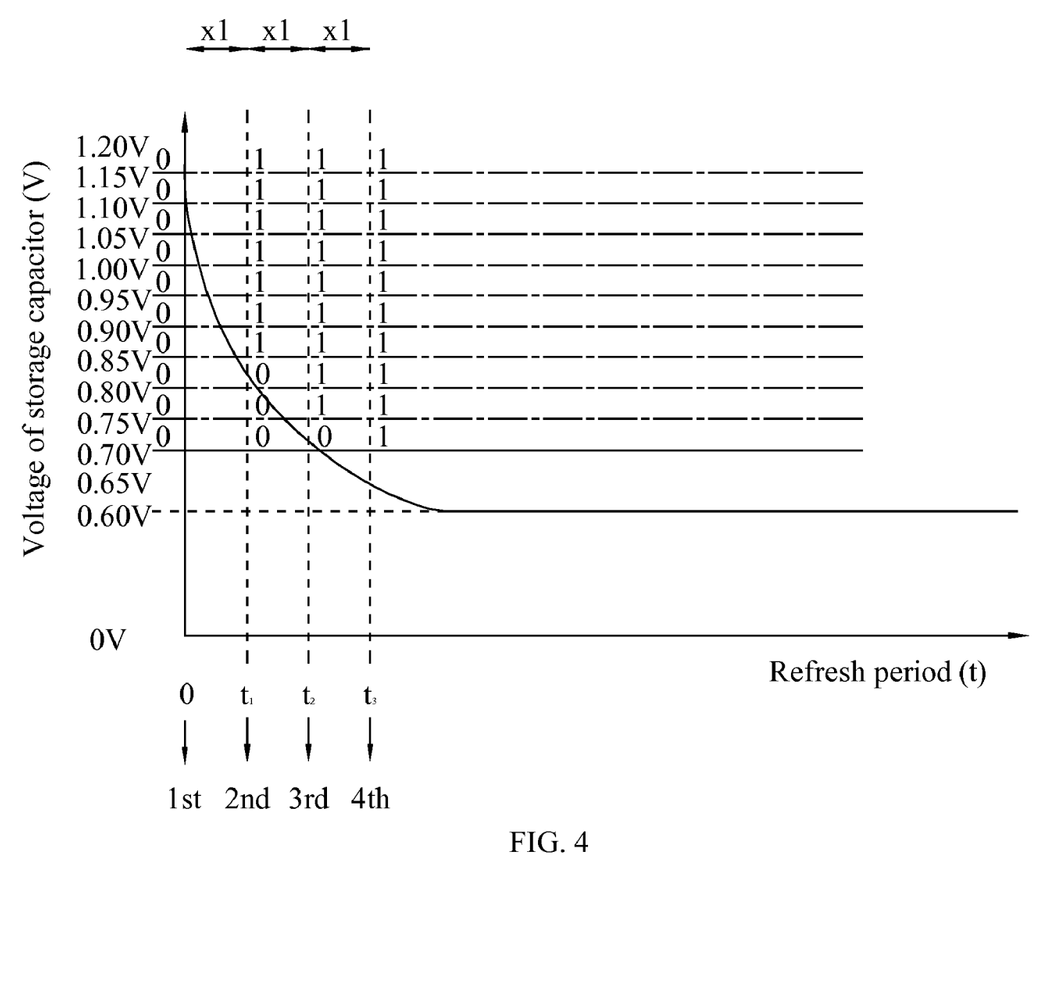
FIG. 4 is a schematic view of a memory refresh system in accordance with a second preferred embodiment of the present invention.

With reference to FIG. 4 for a schematic view of a memory refresh system in accordance with a second preferred embodiment of the present invention, the storage capacitor in the memory is operated at a voltage from $\frac{1}{2}V_{DD}+100$ mV to $V_{DD}$ provided that the memory operating temperature is a high temperature. If the operating voltage of the memory is 1.2V, the storage capacitor will be operated at a voltage from 0.7V to 1.2V.

If time $t=0$, the comparative detective circuit 11 will not perform any detection, and the first state with a combination of digital codes equal to (0000000000) is set as a default value.

If time $t=t_1$, then the comparative detection circuit 11 will perform a first detection, and the comparative detection circuit 11 will also detect a voltage of the storage capacitor 212 of the memory cell 21 in the memory 2, and use the comparator 111 to compare the voltage with the reference voltage to form a second state with a combination of digital codes equal to (1111111000), wherein the first state and the second state have different combination of digital codes, and the refresh period is maintained at $t_1$ to refresh the data of the storage capacitor, such that when the second detection is performed, the detection time $t_2$ is equal to the time $t_1$ of the first detection plus the refresh period $t_1$. In other words, the time $t_2=t_1+t_1$ for the second detection.

If time $t=t_2$, then the comparative detection circuit 11 will perform a second detection, and the comparative detection circuit 11 will detect a voltage of the storage capacitor 212 of the memory cell 21 in the memory 2, and use the comparator 111 to compare the voltage with the reference voltage to form a second state with a combination of digital codes equal to (1111111110), and the first state uses a combination of digital codes at $t=t_1$ as a comparison standard, and whose combination of digital codes is equal to (1111111000), wherein the first state and the second state has different combination of digital codes, and thus the refresh period is maintained at $t_1$ for refreshing data of the storage capacitor, such that when the third detection is performed, the detection time $t_3$ is equal to the time $t_2$ of the second detection plus the refresh period $t_1$. In other words, the time $t_3=t_1+t_1+t_1$ for the third detection.

If time $t=t_3$, then the comparative detection circuit 11 will perform a third detection, and the comparative detection circuit 11 will detect a voltage of the storage capacitor 212 of the memory cell 21 in the memory 2, and use the comparator 111 to compare the voltage with the reference voltage to form a second state with a combination of digital codes equal to (1111111111). If the logic circuit 12 determines that the second state is equal to (1111111111), it means the voltages of the storage capacitors 212 of all memory cells are lower than the reference voltage, the logic circuit 12 will determine to terminate refresh period detecting process, and thus the timing circuit 13 may terminate the refresh period detecting process according to a determination result of the logic circuit 12.

Figure 5:
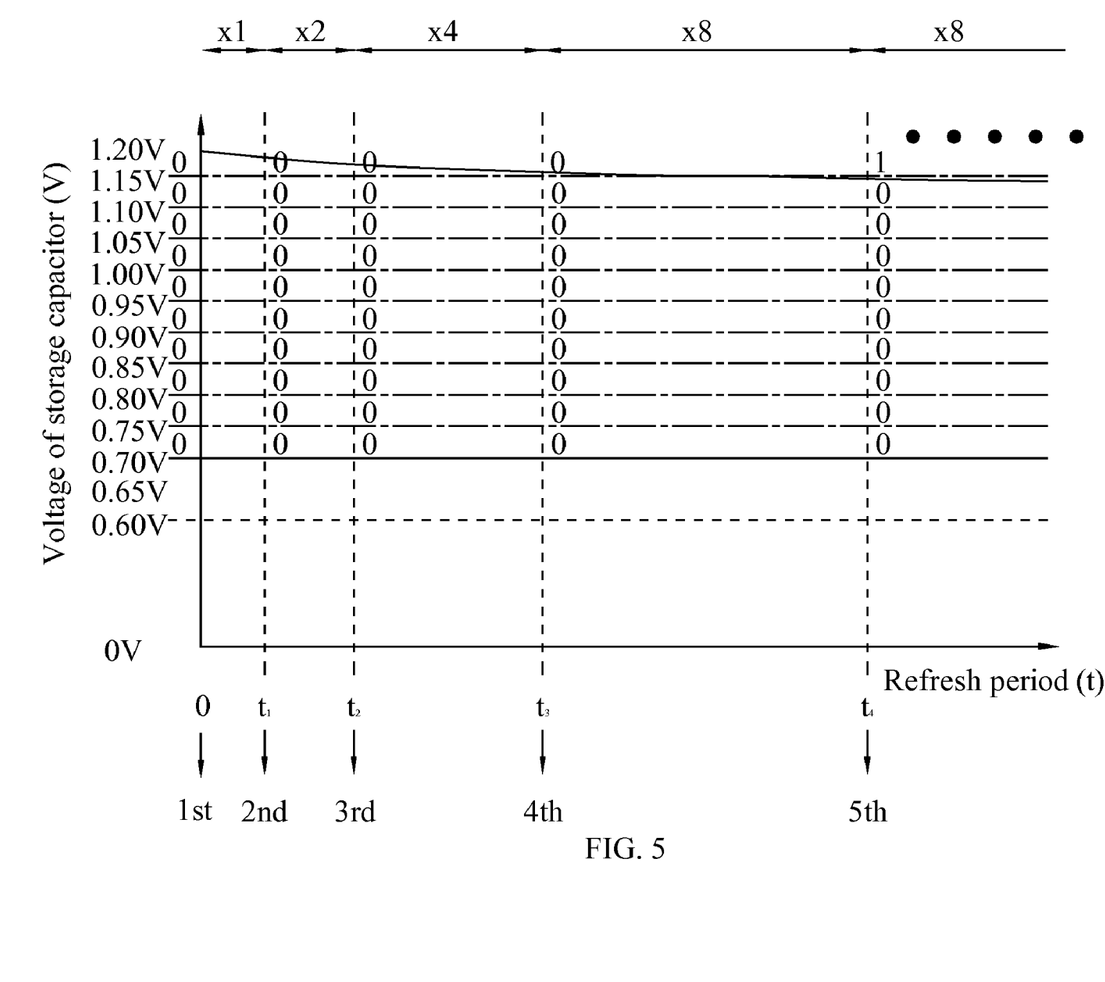
FIG. 5 is a schematic view of a memory refresh system in accordance with a third preferred embodiment of the present invention.

With reference to FIG. 5 for a schematic view of a memory refresh system in accordance with a third preferred embodiment of the present invention, the memory operating temperature is a low temperature, and the storage capacitor in the memory is operated at a voltage from $\frac{1}{2}V_{DD}+100$ mV to $V_{DD}$. If the operating voltage of the memory is 1.2V, and thus the storage capacitor is operated at a voltage from 0.7V to 1.2V.

If time $t=0$, the comparative detective circuit 11 will not perform any detection, and the first state with a combination of digital codes equal to (0000000000) is set as a default value.

If time $t=t_1$, then the comparative detection circuit 11 will perform a first detection, and the comparative detection circuit 11 will detect a voltage of the storage capacitor 212 of the memory cell 21 in the memory 2, and use the comparator 111 to compare the voltage with the reference voltage to form a second state with a combination of digital codes equal to (0000000000), wherein the first state and the second state have the same combination of digital codes, and thus the refresh period is increased to refresh the data of the storage capacitor. If two times of the refresh period are used for performing the second detection, the detection time $t_2$ is equal to the time $t_1$ of the first detection plus two times of the refresh period $t_1$. In other words, the time $t_2=t_1+2t_1$ for the second detection.

If time $t=t_2$, then the comparative detection circuit 11 will perform a second detection, and the comparative detection circuit 11 will detect a voltage of the storage capacitor 212 of the memory cell 21 in the memory 2, and use the comparator 111 to compare the voltage with the reference voltage to form a second state with a combination of digital codes equal to (0000000000), and the first state uses a combination of digital code at $t=t_1$ as a comparison standard, and whose combination of digital codes is (0000000000), wherein the first state and the second state have a same combination of digital code, such that the refresh period is increased to refresh data of the storage capacitor. For example, two times of the refresh period are used for performing a third detection, the detection time $t_3$ is equal to the time $t_2$ of the second detection plus the refresh period $4t_1$. In other words, the time $t_3=t1+2t_1+4t_1$ for the third detection.

If time $t=t_3$, then the comparative detection circuit 11 will perform a third detection, and the comparative detection circuit 11 will detect a voltage of the storage capacitor 212 of the memory cell 21 in the memory 2, and use the comparator 111 to compare the voltage with the reference voltage to form a second state with a combination of digital codes equal to (0000000000), and the first state uses a combination of digital codes at $t=t_2$ as a comparison standard, and whose combination of digital codes is (0000000000), wherein the first state and the second state have a same combination of digital code, such that the refresh period is increased to refresh data of the storage capacitor. If two times of the refresh period are used for performing a fourth detection, the detection time $t_4$ is equal to the time $t_3$ of the third detection plus the refresh period $8t_1$. In other words, the time $t_4=t_1+2t_1+4t_1+8t_1$ for the fourth detection.

If time $t=t_4$, then the comparative detection circuit 11 will perform a fourth detection, and the comparative detection circuit 11 will detect a voltage of the storage capacitor 212 of the memory cell 21 in the memory 2, and use the comparator 111 to compare the voltage with the reference voltage to form a second state with a combination of digital codes equal to (1000000000), and the first state uses a combination of digital code at $t=t_3$ as a comparison standard, and whose combination of digital codes is (0000000000), wherein the first state and the second state have different combination of digital codes, so that the refresh period is maintained to be $8t_1$ for refreshing data of the storage capacitor. When a fifth detection is performed, the detection time $t_5$ is equal to the time $t_4$ of the fourth detection plus the refresh period $8t_1$. In other words, the time $t_5=t_1+2t_1+4t_1+8t_1+8t_1$ for the fifth detection. If the logic circuit 12 determines that the second state is (1111111111), it means that the voltages of the storage capacitors 212 of all memory cells 21 are lower than the reference voltage, the logic circuit 12 will terminate refresh period detecting process, and thus the timing circuit 13 may terminate the refresh period detecting process according to a determination result of the logic circuit 12.

Figure 6:
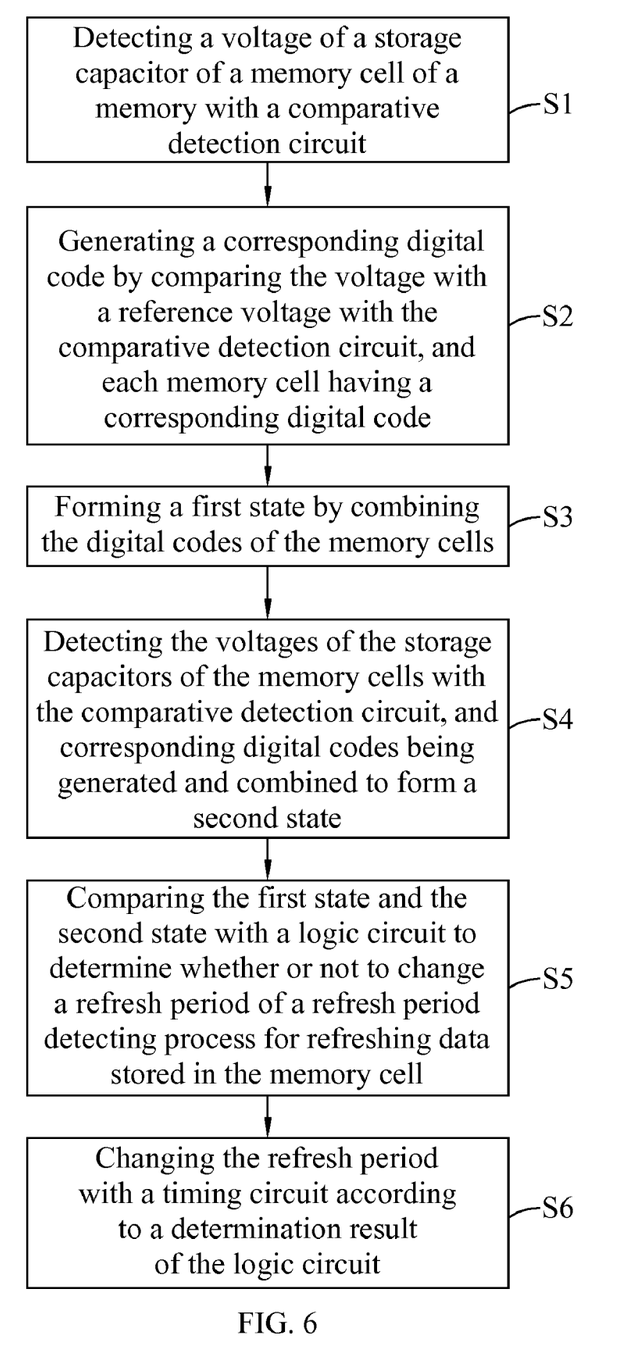
FIG. 6 is a flow chart of an operating method of a memory refresh system in accordance with the present invention.

With reference to FIG. 6 for a flow chart of an operating method of a memory refresh system in accordance with the present invention, the operating method of the memory refresh system comprises the following steps. In Step S1, detecting a voltage of a storage capacitor of a memory cell of a memory with a comparative detection circuit. In Step S2, generating a corresponding digital code by comparing the voltage with a reference voltage with the comparative detection circuit, and each memory cell having a corresponding digital code. In Step S3, forming a first state by combining the digital codes of the memory cells. In Step S4, detecting the voltages of the storage capacitors of the memory cells with the comparative detection circuit, and corresponding digital codes being generated and combined to form a second state. In Step S5, comparing the first state and the second state with a logic circuit to determine whether or not to change a refresh period of a refresh period detecting process for refreshing data stored in the memory cell. In Step S6, changing the refresh period with a timing circuit according to a determination result of the logic circuit.

Figure 7:
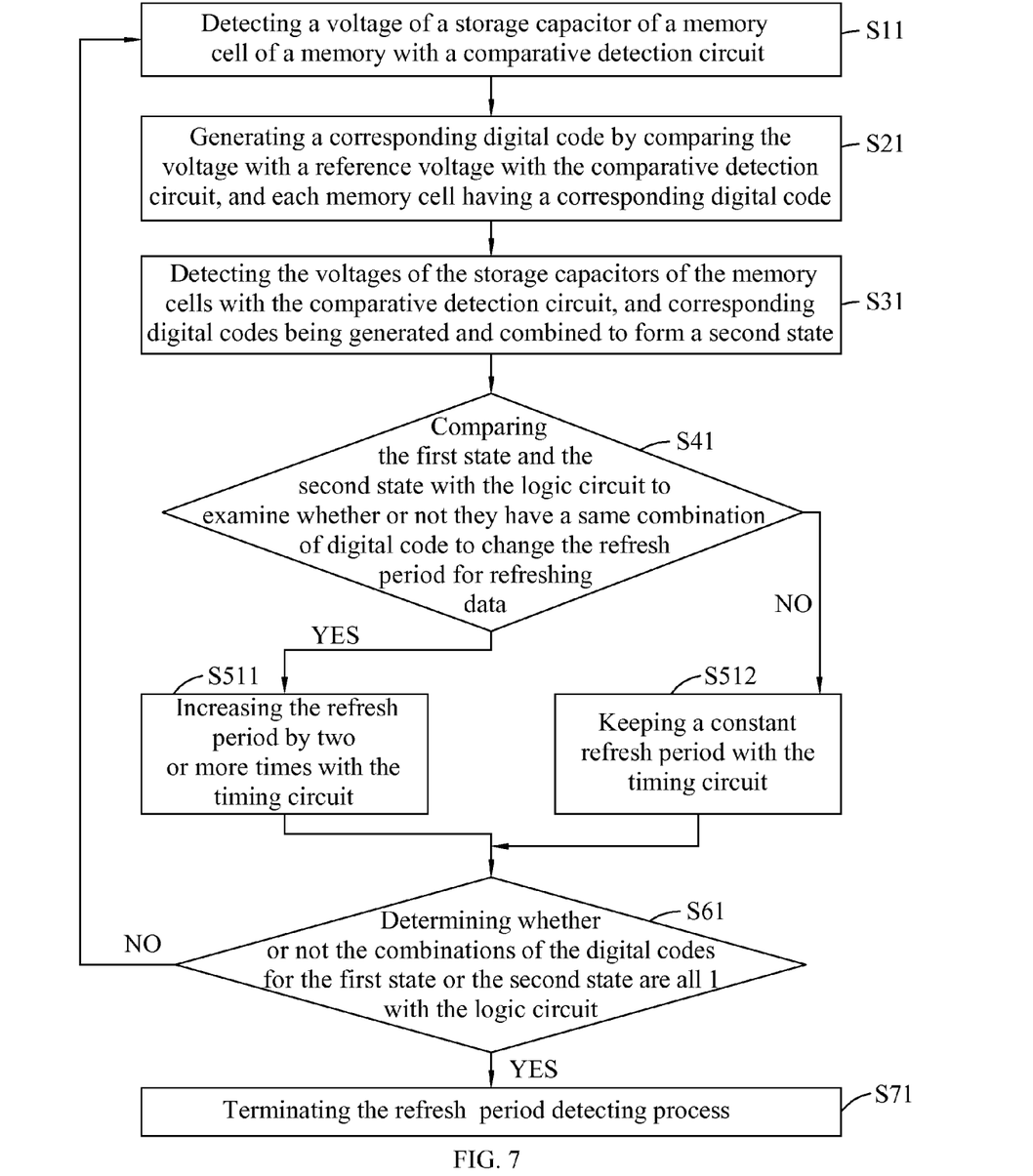
FIG. 7 is a flow chart of an operating method of a memory refresh system in accordance with a first preferred embodiment of the present invention.

With reference to FIG. 7 for a flow chart of an operating method of a memory refresh system in accordance with a first preferred embodiment of the present invention, the operation method comprises the following steps. In Step S11, detecting a voltage of a storage capacitor of a memory cell of a memory with a comparative detection circuit. In Step S21, generating a corresponding digital code by comparing the voltage with a reference voltage with the comparative detection circuit, and each memory cell having a corresponding digital code. The combination of the corresponding digital codes defines a first state. For example, each of the digital codes may be generated as (0000000000) by default, and the combination of which forms a first state. In Step S31, detecting the voltages of the storage capacitors of the memory cells with the comparative detection circuit, and corresponding digital codes being generated and combined to form a second state. After a specific period of time, then Step S41 will be performed, comparing the first state and the second state with the logic circuit to examine whether or not they have a same combination of digital code to change the refresh period for refreshing data. If the first state and the second state have the same combination of digital code, then Step S511 will be performed, increasing the refresh period by two or more times with the timing circuit. If the first state and the second state have different combination of digital codes, then Step S512 will be performed, keeping a constant refresh period with the timing circuit. In Step S61, Determining whether or not the combinations of the digital codes for the first state or the second state are all 1 with the logic circuit. If the first state or second state has a combination of digital codes equal to 1, then Step S71 will be performed, terminating the refresh period detecting process. If the first state or the second state has a combination of digital code not equal to 1, then Step S11 will be performed.

The present invention uses a differential method to detect digital codes corresponding to the voltages of a same group of memory cells (a 10-bit digital code corresponds to ten groups of memory cells). With the voltage division method and the differential type, the chip is affected by a voltage fluctuation and a process variation and may be cancelled.

In a DRAM, the method used in the present invention has not destroyed the structure of the memory cell, and the traditional reading method used by the DRAM is used for reading the voltage of the memory cell, in order to avoid unnecessary influence to the original structure of the memory cell by a parasitic effect.

In general, a parasitic capacitance $C_{DL}$ (or $C_{BL}$) on a bit line BL (or a data line DL) generally has a relatively large numeric value, which is much higher than the memory cell ($C_{BL}>C_S$), and thus if it is necessary to read a numeric value (data "0" or data "1") stored in the memory cell, then a charge sharing mechanism as given below is adopted:

$$V=V(\text{BL})-[V(\text{BL}) \times C_{BL}+V(\text{SN}) \times C_S]/(C_{BL}+C_S)=|C_S \times [V(\text{BL})-V(\text{SN})]/(C_{BL}+C_S)|$$

Since $C_{BL}>C_S$, therefore the numeric value of $\Delta V$ may not sow the original voltage of the memory cell after the charge sharing takes place, if the voltage at the bit line BL is not much higher than the voltage of the memory cell. The present invention follows the equation of the original charge sharing as follows:

$$\Delta V = |C_S \times [V(BL) - V(SN)]/(C_{BL} + C_S)|$$

If several memory cells are connected in parallel and the bit line BL and the word line WL are connected together (if a large number of memory cells are used, each memory cell possesses a capacitance of $5 \times 10^{-15}$ farad), and the equation can be simplified as follows:

$$\Delta V = |C_S \times [V(BL) - V(SN)]/(C_{BL} + C_S)| \sim |V(BL) - V(SN)|$$

Therefore, such method no longer needs to compare the read value with a value of the look-up table to find a corresponding value of the memory cell.

What is claimed is:

1. A memory refresh system, comprising:
    a comparative detection circuit, detecting a voltage of a storage capacitor of a memory cell of a memory, and generating a corresponding digital code by comparing the voltage with a reference voltage, each of the memory cell having a corresponding digital code, the combination of the digital codes of the memory cells forming a first state, after a specific period of time, the voltages of the storage capacitors of the memory cells being once detected by the comparative detection circuit, and corresponding digital codes being generated and combined to form a second state;
    a logic circuit, comparing the first state and the second state to determine whether or not to change a refresh period of a refresh period detecting process for refreshing data stored in the memory cell; and
    a timing circuit, selectively changing the refresh period or terminating the refresh period detecting process according to a determination result of the logic circuit;
    wherein the refresh period is increased by two or more times if the first state and the second state have the same combination of digital codes, the refresh period is constant if the first state and the second state have a different combination of digital codes, and the logic circuit terminates the refresh period detecting process for refreshing data if the voltage of all memory cell are lower than the reference voltage.

2. The memory refresh system of claim 1, wherein the memory cell is formed with a transistor and the storage capacitor.

3. The memory refresh system of claim 1, wherein the voltage is operated at a range from ½VDD+100 mV to VDD.

4. The memory refresh system of claim 1, wherein the memory refresh system uses a differential method to detect each of the memory cell to generate the digital code.

5. The memory refresh system of claim 4, wherein the memory refresh system uses a voltage division method and the differential method to overcome a voltage fluctuation and a process variation of the memory.

6. The memory refresh system of claim 1, wherein the memory refresh system uses a DRAM reading method to read the voltage of the memory cell in order to prevent a parasitic effect from affecting a structure of the memory cell.

7. An operating method of a memory refresh system, comprising the steps of:
    detecting a voltage of a storage capacitor of a memory cell of a memory with a comparative detection circuit;
    generating a corresponding digital code by comparing the voltage with a reference voltage with the comparative detection circuit, and each of the memory cell having a corresponding digital code;
    forming a first state by combining the digital codes of the memory cells;
    detecting the voltages of the storage capacitors of the memory cells with the comparative detection circuit, and corresponding digital codes being generated and combined to form a second state;
    comparing the first state and the second state with a logic circuit to determine whether or not to change a refresh period of a refresh period detecting process for refreshing data stored in the memory cell; and
    selectively changing the refresh period or terminating the refresh period detecting process with a timing circuit according to a determination result of the logic circuit;
    wherein the refresh period is increased by two or more times if the first state and the second state have the same combination of digital codes, the refresh period is constant if the first state and the second state have a different combination of digital codes, and the logic circuit terminates the refresh period detecting process for refreshing data if the voltage of all memory cell are lower than the reference voltage.

8. The operating method of the memory refresh system as recited in claim 7, wherein the memory cell is formed with a transistor and the storage capacitor.

9. The operating method of a memory refresh system as recited in claim 7, wherein the voltage is operated at a range from ½VDD+100 mV to VDD.

10. The operating method of the memory refresh system as recited in claim 7, wherein the memory refresh system uses a differential method to detect each of the memory cell to generate the digital code.

11. The operating method of the memory refresh system as recited in claim 10, wherein the memory refresh system uses a voltage division method and the differential method to overcome a voltage fluctuation and a process variation of the memory.

12. The operating method of the memory refresh system as recited in claim 7, wherein the memory refresh system uses a DRAM reading method to read the voltage of the memory cell in order to prevent a parasitic effect from affecting a structure of the memory cell.

* * * * *